(12) United States Patent
Gailus et al.

(10) Patent No.: US 7,646,257 B2
(45) Date of Patent: Jan. 12, 2010

(54) METHOD AND APPARATUS TO FACILITATE THE PROVISION AND USE OF A PLURALITY OF VARACTORS WITH A PLURALITY OF SWITCHES

(75) Inventors: Paul H. Gailus, Prospect Heights, IL (US); Joseph A. Charaska, Melrose Park, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 11/621,769

(22) Filed: Jan. 10, 2007

(65) Prior Publication Data

US 2008/0164956 A1 Jul. 10, 2008

(51) Int. Cl.
*H03B 5/12* (2006.01)
(52) U.S. Cl. ................. 331/177 V; 331/179; 334/78
(58) Field of Classification Search ............... 331/36 C, 331/117 R, 117 FE, 167, 177 V, 177 R, 179; 333/174; 334/14, 15, 78; 455/195
See application file for complete search history.

(56) References Cited

U.S. PATENT DOCUMENTS

| | | | |
|---|---|---|---|
| 4,713,631 A | | 12/1987 | Enderby |
| 5,739,730 A | * | 4/1998 | Rotzoll ................. 331/177 V |
| 2002/0171499 A1 | * | 11/2002 | Momtaz et al. ........ 331/117 FE |
| 2005/0068119 A1 | * | 3/2005 | Uozumi et al. ............. 331/179 |
| 2005/0128008 A1 | * | 6/2005 | Perry et al. .................. 331/16 |
| 2005/0275478 A1 | * | 12/2005 | Tsukizawa et al. ...... 331/117 R |

FOREIGN PATENT DOCUMENTS

JP 2005117428 A * 4/2005

OTHER PUBLICATIONS

Oh, et al., "A 74%, 1.56-2.71 GHZ, Wide-Tunable LC-Tuned VCO in 0.35UM CMOS Technology", Microwave and Optical Tech. Letters, Apr. 20, 2003, pp. 98-100.

* cited by examiner

*Primary Examiner*—Robert Pascal
*Assistant Examiner*—Ryan J. Johnson
(74) *Attorney, Agent, or Firm*—Valerie M. Davis (57) ABSTRACT

A plurality of varactors are coupled via a first electrode to a shared terminal that in turn can operably couple to a source of control voltage. A second electrode for each varactor couples to a corresponding switch, where each switch couples to at least two different voltage levels. So configured, the second electrode of each varactor can be individually connected to either of two voltage levels. This can be leveraged to control, in coarse steps, the overall aggregate effective capacitance presented by these components. At least some of these varactors can have differing corresponding capacitances, the specific values of which can be selected in order to facilitate relatively equal spacing and substantially equal rates of reactance change versus the control voltage value between aggregate-capacitive reactance ranges as correspond to differing settings for the switches at various levels for the control voltage source.

18 Claims, 4 Drawing Sheets

| | SWITCH POSITION | | | |
|---|---|---|---|---|
| CURVE | Si | Sj | Sk | Sl |
| A | 0 | 0 | 0 | 0 |
| B | 1 | 0 | 0 | 0 |
| C | 1 | 1 | 0 | 0 |
| D | 1 | 1 | 1 | 0 |
| E | 1 | 1 | 1 | 1 |

METHOD AND APPARATUS TO FACILITATE THE PROVISION AND USE OF A PLURALITY OF VARACTORS WITH A PLURALITY OF SWITCHES

TECHNICAL FIELD

The technical field relates generally to varactors and capacitive tuners.

BACKGROUND

Varactor diodes (referred to herein as "varactors") are well known in the art. Such components serve a myriad of purposes. As one illustration in this regard, varactors are sometimes used to facilitate the provision of a voltage controlled oscillator. For example, high-Q varactor diodes can be used to embody a voltage controlled oscillator that is effective, in turn, to provide sufficient synthesizer tuning range and spectral purity of a high performance frequency synthesizer as might be used in a modern multi-band two-way wireless platform.

There are certain problems with such an approach, however. As one example in this regard, integrated circuit manufacturers are continuing to move towards advanced low voltage processes. 1.8 volt processes, for example, represent a particularly coveted design requirement, goal, and opportunity at present. The aforementioned use of varactors, however, seems to conflict with such a trend. In particular, a typical approach to achieving the desired synthesizer tuning range and spectral purity specifies use of high-Q varactors that are driven by steering line output excursions equal to or exceeding ten volts. Such an operational requirement, of course, seems utterly unachievable using a low voltage process such as the aforementioned 1.8 volt process.

As one approach to resolving this dilemma, one might move the synthesizer charge pump off of the integrated circuit that provides the transceiver functionality of a corresponding wireless platform. Such an approach, however, leaves much to be desired. The charge pump, comprising a relatively complicated circuit in and of itself, would require implementation as a separate integrated circuit in order to approach commercial acceptability. This separate integrated circuit would typically require a relatively high voltage process as noted above. Unfortunately, fabrication facilities are increasingly moving to lower voltage processes. This, in turn, raises the very real problem of being unable to reliably source such a part. Furthermore, such an approach does nothing to address another point of concern in such an application setting; power consumption. These high voltage architectures tend to represent a significant load and hence result in relatively high charge pump power dissipation.

Another approach found in the prior art to attempt to achieve the required tuning range is to selectively apply shunt capacitance across the varactor to increase the total capacitance value. This approach, however, also tends to reduce the rate of change of reactance versus control voltage. This, in turn, tends to prompt the undesirable effect of reducing tuning sensitivity.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

DETAILED DESCRIPTION

Before describing in detail embodiments that are in accordance with the present invention, it should be observed that the embodiments reside primarily in combinations of method steps and apparatus components related to a method and apparatus to facilitate the provision and use of a plurality of varactors with a plurality of switches. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein. Thus, it will be appreciated that for simplicity and clarity of illustration, common and well-understood elements that are useful or necessary in a commercially feasible embodiment may not be depicted in order to facilitate a less obstructed view of these various embodiments.

Generally speaking, pursuant to these various embodiments, a plurality of varactors, each having a first and second electrode, are each coupled via the first electrode to a shared terminal that in turn can operably couple to a source of control voltage. If desired, this source of control voltage can comprise a continuously variable direct current voltage. The remaining second electrode for each such varactor then couples to a corresponding switch, where each such switch couples to at least a first and a second voltage level that differ from one another. So configured, the second electrode of each varactor can be individually connected to either of a first voltage level and a second voltage level.

This, in turn, can be leveraged to control, in coarse steps, the overall aggregate effective capacitance presented by these components. By one approach, at least some of these varactors can have differing corresponding capacitances, the specific values of which can be selected in order to facilitate relatively equal spacing between aggregate-capacitive reactance ranges as correspond to differing settings for the switches at various levels for the control voltage source and such that a rate of change of reactance versus control voltage is substantially maintained for the differing settings.

So configured, a relatively wide range of capacitive values become available for use, for example, in a wireless communication device while remaining within the limits that are otherwise imposed by a relatively low voltage process such as a 1.8 volt process. This in turn permits such a capacitive tuning element to be co-fabricated, in whole or in part, on a shared integrated circuit that also contains and supports at least a substantial portion of the wireless communication device's functionality. Accordingly, a varactor-based approach can serve to provide a variable capacitance capability in an application setting where previously such seemed unavailable.

Those skilled in the art will realize that the above recognized advantages and other advantages described herein are merely exemplary and are not meant to be a complete rendering of all of the advantages of the various embodiments of the present invention. These and other benefits may become clearer upon making a thorough review and study of the following detailed description.

Figure 1:
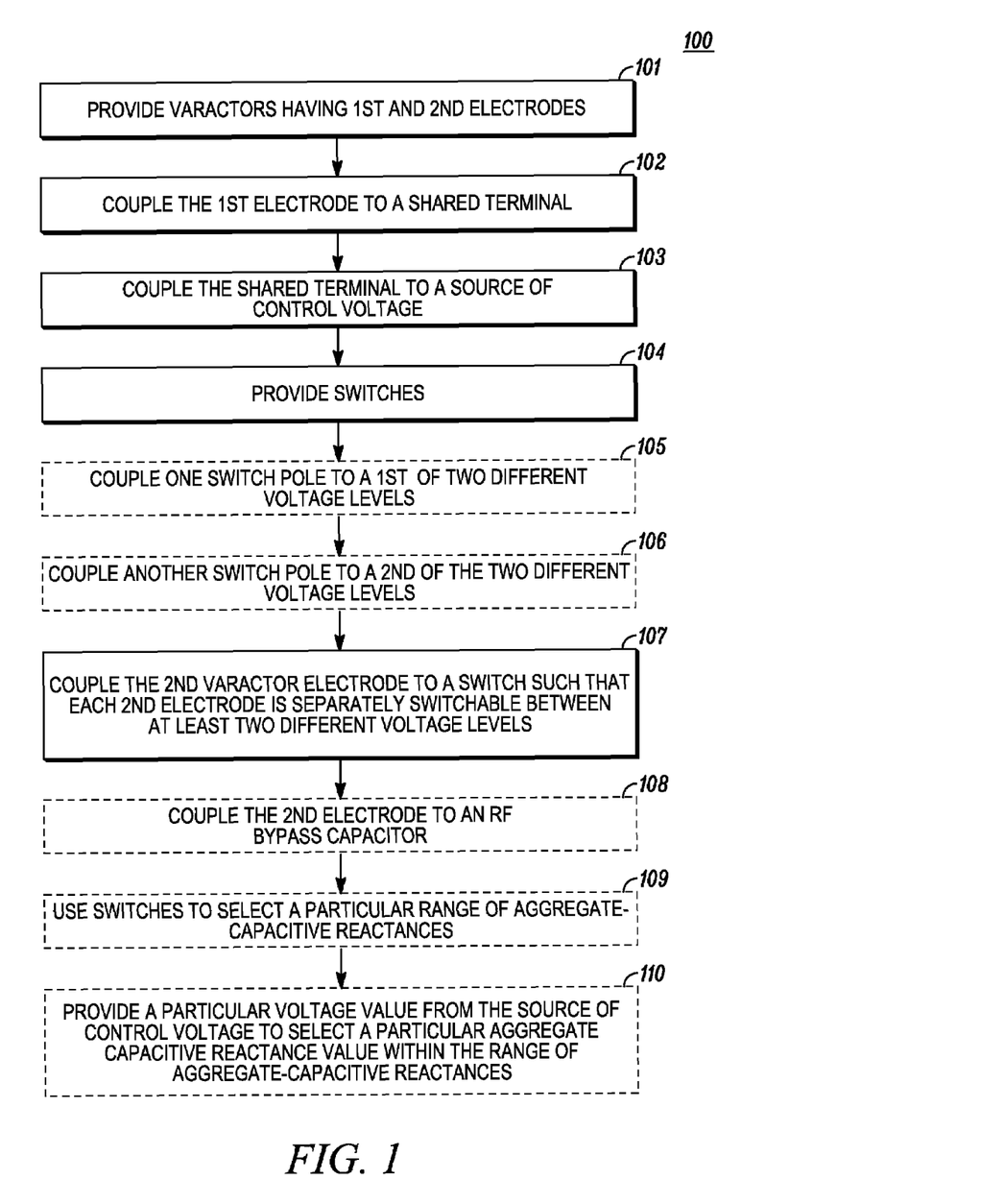
FIG. 1 comprises a flow chart as configured in accordance with various embodiments of the invention.
Figure 2:
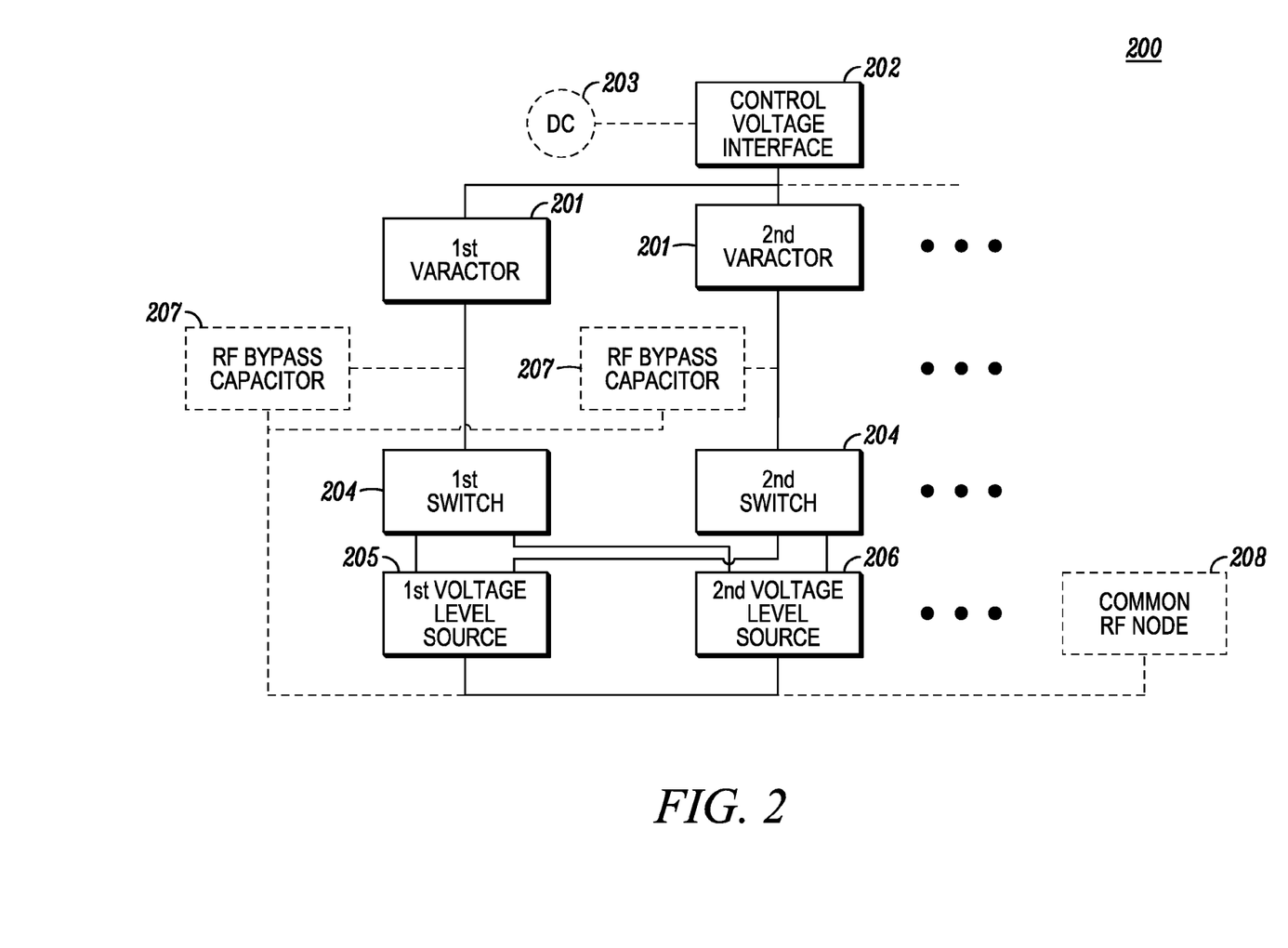
FIG. 2 comprises a block diagram as configured in accordance with various embodiments of the invention.

Referring now to the drawings, and in particular to FIG. 1, a representative process 100 provides 101 a plurality of varactors wherein each of the varactors has a first electrode and a second electrode. As illustrated in FIG. 2, this may comprise at least a first and a second such varactor 201 with any number of additional varactors being provided as appropriate to meet the needs of a given application setting. By one approach, at least some of these varactors 201 have differing corresponding capacitances. In particular, and as will be explained below in more detail, this can comprise selecting the differing corresponding capacitances in order to facilitate relatively equal spacing between aggregate-capacitive reactance ranges as correspond to differing settings for a plurality of switches at various levels for a source of control voltage.

Referring again to FIG. 1, this process 100 also provides for coupling 102 the first electrode for each of the plurality of varactors to a shared terminal and for coupling 103 that shared terminal to a source of control voltage. As illustrated in FIG. 2, this can comprise coupling that first electrode for each of the varactors 201 to a control voltage interface 202 that in turn facilitates coupling to, for example, a source of control voltage 203 such as a charge pump that provides a substantially continuously variable direct current voltage. Such sources and their manner of fabrication are well known in the art and require no further elaboration here save to note that, by one approach, this source of control voltage 203 can further comprise a relatively low voltage signal source.

Referring again to FIG. 1, this process 100 further provides for provision 104 of a plurality of switches. As suggested by the illustrative embodiment presented in FIG. 2, these teachings will accommodate provision of such a switch 204 on a one-to-one basis for each of the varactors 201. These switches 204 may comprise, for example, transistors of a particular type and configuration as depends upon the needs and/or opportunities represented by a given application setting as will be well understood by one skilled in the art.

By one approach, as suggested by FIG. 1 and as is shown in FIG. 2, one switch pole for each of the plurality of switches 204 can be operably coupled 105 to a first voltage level source 205 while another switch pole of each of the plurality of switches 204 is coupled 106 to a second voltage level source 206. By one approach, the first and second voltage level sources 205 and 206 are different from one another by some appreciable amount. It would also be possible to provide additional voltage level sources as suggested by FIG. 2 and/or to provide switches 204 having additional poles that can be similarly coupled to such additional voltage level sources when available. For the sake of simplicity and clarity, however, the illustrative embodiments described herein are based upon provision of only a first and a second voltage level source 205 and 206.

As shown in FIG. 1 and as is also shown in FIG. 2, the second electrode for each of the plurality of varactors 201 can be coupled 107 to a corresponding one of the plurality of switches 204 such that the second electrode for each of these varactors 201 is separately switchable between at least two different voltage levels (e.g., the first and second voltage levels as correspond to the above-described first and second voltage level sources 205 and 206). If desired, one may also optionally couple 108 the second electrode for such varactors 201 to a corresponding radio frequency (RF) bypass capacitor 207 thereby eliminating any RF constraints being applied to the design of the switches 204. By one particular illustrative approach in this regard, such RF bypass capacitors 207, when provided, can couple between the aforementioned second electrodes and a common RF node 208.

So configured, those skilled in the art will recognize and appreciate that the described circuitry can be employed as a capacitive tuning element 200. In particular, the plurality of switches 204 can be used 109 to select a particular range of aggregate-capacitive reactances. One may then provide 110 a particular voltage value from the aforementioned source of control voltage 203 to thereby select a particular aggregate capacitive reactance value (which particular value lies within this particular range of aggregate-capacitive reactances). Using this approach, the overall voltage range required to achieve a particular range of capacitance values for the capacitive tuning element 200 can be considerably more constrained than as would ordinarily be expected using prior art techniques in this regard.

Figure 3:
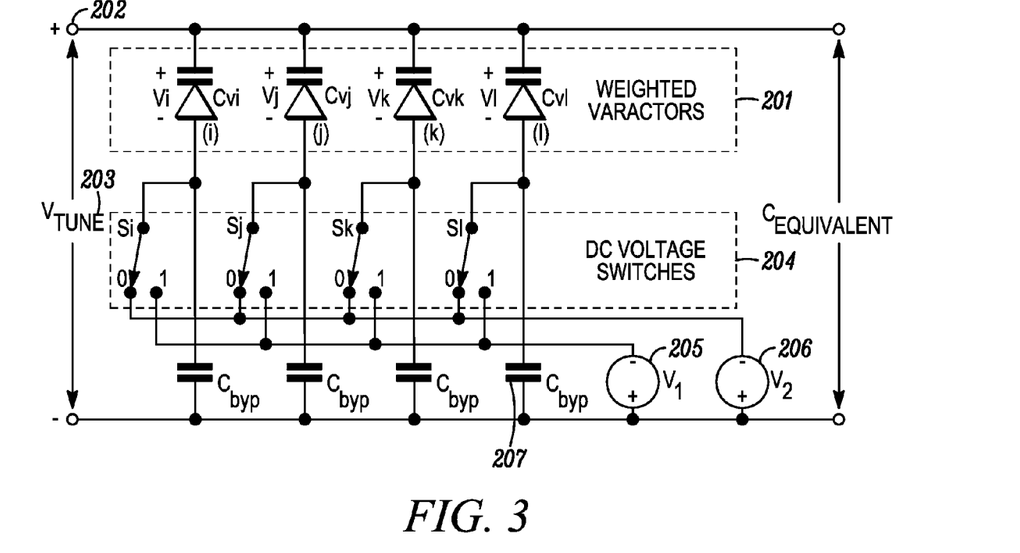
FIG. 3 comprises a schematic diagram as configured in accordance with various embodiments of the invention.

To aid in facilitating an understanding of the operation and use of such a capacitive tuning element 200, a more particular example will be explained upon making reference to FIG. 3. Those skilled in the art will recognize and understand that this example is offered by way of illustration and does not constitute an exhaustive discourse in this regard. Accordingly, the details as pertain to this particular illustrative example are not to be taken as comprising limitations with respect to the nature, scope, or application of these teachings.

As alluded to above, an overall aggregate capacitance $C_{equivalent}$ for the capacitive tuning element is comprised of a contribution from each of the varactors 201. As noted above, if desired, the capacitive contribution of each of the varactors 201 can be individually selected. By one approach, such selections can be calculated in a manner that tends to achieve a series of available corresponding aggregate-capacitive reactance ranges that are relatively equally spaced apart and have substantially equal rates of reactance change versus the control voltage value as the switches 204 are configured in different ways.

Figure 4:
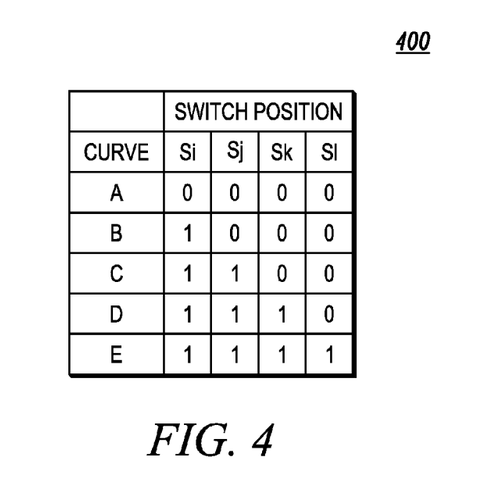
FIG. 4 comprises a chart.

In this illustrative embodiment there are four varactors 201 that each have a corresponding capacitance (labeled $C_{vi}$ through $C_{vl}$). For the purpose of explanation and illustration, the differences between such capacitance values correspond to a weighting value for each varactor 201 (represented here by i through l). Those skilled in the art will recognize and understand that a different range of capacitive reactance values are possible with each switch configuration. To illustrate this, and referring momentarily to FIG. 4, a first range of values (represented here by the nomenclature "Curve A") will correspond to when all four of the depicted switches Si through Sl are set to a "0" position. Similarly, a second range of values (represented here by the nomenclature "Curve B") will correspond to when three of the depicted switches Sj through Sl are set to the "0" position while the fourth switch $S_i$ is set to the "1" position (which corresponds in this embodiment to connecting the second electrode of the first varactor to the first voltage level 205 represented here by $V_1$). Curves C through E are similarly achieved through other switch position configurations as illustrated in table 400.

Figure 5:
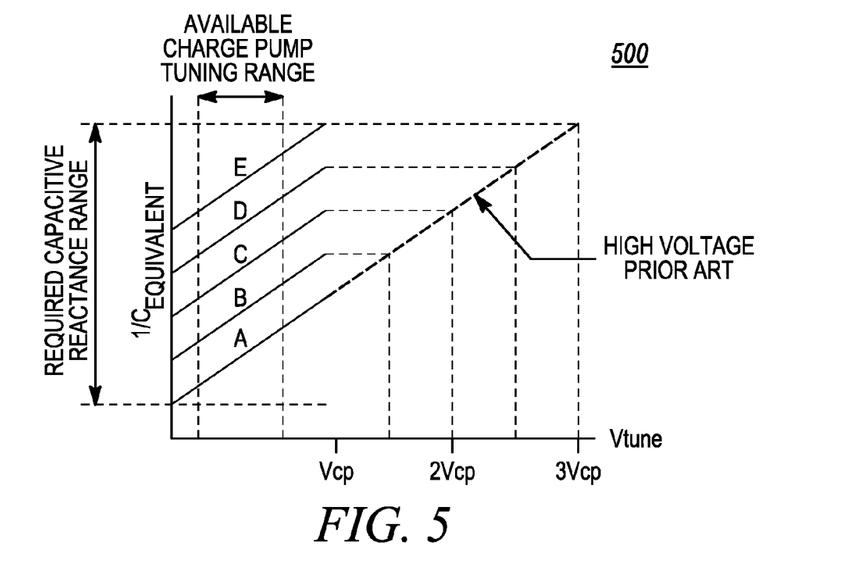
FIG. 5 comprises a graph as corresponds to the chart of FIG. 4.

Referring now to FIG. 5, it can be seen that these various curves A through E represent, in the aggregate, a number of candidate available aggregate capacitive values 500 that correspond to a required capacitance range. Particular capacitive values within a given one of these ranges/curves is then selected by selection of a particular control voltage value. The illustration of FIG. 5 depicts generally that essentially any capacitance value within the required capacitance range can be obtained by setting the switches to select a particular range of potential values and then using the control voltage to select a particular value within that range.

This illustration of FIG. 5 also depicts that such a result is achieved notwithstanding that the control voltage is constrained to a relatively low upper level (shown as $V_{cp}$ in FIG. 5). To achieve a similar range of capacitance values using at least some prior art approaches, it would be necessary to provide an upper control voltage level that at least triples this relatively low upper level. As noted above, however, the availability of a generous voltage range is becoming a luxury that designers cannot continue to rely upon and hence the ability of the present teachings to provide a similar range of capacitance values using a considerably reduced range of voltages represents a highly desired and readily leveraged capability.

The following illustrates an example of a method to calculate the varactor weighting factors i, j, k and l illustrated in the above figures.

Curve Definitions $$\text{Curve } A = \left((i+j+k+l)\frac{Cj0}{\left(1+\frac{Vtune+V_2}{Vj}\right)^m}\right)^{-1} \quad \text{EQ. 1}$$

$$\text{Curve } B = \quad \text{EQ. 2}$$
$$\left((i)\frac{Cj0}{\left(1+\frac{Vtune+V_1}{Vj}\right)^m} + (j+k+l)\frac{Cj0}{\left(1+\frac{Vtune+V_2}{Vj}\right)^m}\right)^{-1}$$

$$\text{Curve } C = \quad \text{EQ. 3}$$
$$\left((i+j)\frac{Cj0}{\left(1+\frac{Vtune+V_1}{Vj}\right)^m} + (k+l)\frac{Cj0}{\left(1+\frac{Vtune+V_2}{Vj}\right)^m}\right)^{-1}$$

$$\text{Curve } D = \quad \text{EQ. 4}$$
$$\left((i+j+k)\frac{Cj0}{\left(1+\frac{Vtune+V_1}{Vj}\right)^m} + (l)\frac{Cj0}{\left(1+\frac{Vtune+V_2}{Vj}\right)^m}\right)^{-1}$$

$$\text{Curve } E = \left((i+j+k+l)\frac{Cj0}{\left(1+\frac{Vtune+V_1}{Vj}\right)^m}\right)^{-1} \quad \text{EQ. 5}$$

Define Equivalences (for a specific illustrative embodiment):

$$\text{Curve } A\left(Vtune = \frac{3}{2}Vcp, V_2 = 0\right) = \quad \text{EQ. 6}$$
$$\text{Curve } B(Vtune = Vcp, V_1 = 2Vcp, V_2 = 0)$$

$$\text{Curve } A(Vtune = 2Vcp, V_2 = 0) = \quad \text{EQ. 7}$$
$$\text{Curve } C(Vtune = Vcp, V_1 = 2Vcp, V_2 = 0)$$

$$\text{Curve } A\left(Vtune = \frac{5}{2}Vcp, V_2 = 0\right) = \quad \text{EQ. 8}$$
$$\text{Curve } D(Vtune = Vcp, V_1 = 2Vcp, V_2 = 0)$$

$$\text{Curve } A(Vtune = 3Vcp, V_2 = 0) = \quad \text{EQ. 9}$$
$$\text{Curve } E(Vtune = Vcp, V_1 = 2Vcp, V_2 = 0)$$

Develop Expressions:
using EQ. 1, EQ. 2 and EQ. 6

$$a = \frac{i}{j+k+l} = \frac{\left(1+3\frac{Vcp}{Vj}\right)^m\left(1+\frac{3}{2}\frac{Vcp}{Vj}\right)^m - \left(1+3\frac{Vcp}{Vj}\right)^m\left(1+\frac{Vcp}{Vj}\right)^m}{\left(1+3\frac{Vcp}{Vj}\right)^m\left(1+\frac{Vcp}{Vj}\right)^m - \left(1+\frac{3}{2}\frac{Vcp}{Vj}\right)^m\left(1+\frac{Vcp}{Vj}\right)^m} \quad \text{EQ. 10}$$

using EQ. 1, EQ. 3 and EQ. 7

$$b = \frac{i+j}{k+l} = \frac{\left(1+3\frac{Vcp}{Vj}\right)^m\left(1+2\frac{Vcp}{Vj}\right)^m - \left(1+3\frac{Vcp}{Vj}\right)^m\left(1+\frac{Vcp}{Vj}\right)^m}{\left(1+3\frac{Vcp}{Vj}\right)^m\left(1+\frac{Vcp}{Vj}\right)^m - \left(1+2\frac{Vcp}{Vj}\right)^m\left(1+\frac{Vcp}{Vj}\right)^m} \quad \text{EQ. 11}$$

using EQ. 1, EQ. 4 and EQ. 8

$$c = \frac{i+j+k}{l} = \frac{\left(1+3\frac{Vcp}{Vj}\right)^m\left(1+\frac{5}{2}\frac{Vcp}{Vj}\right)^m - \left(1+3\frac{Vcp}{Vj}\right)^m\left(1+\frac{Vcp}{Vj}\right)^m}{\left(1+3\frac{Vcp}{Vj}\right)^m\left(1+\frac{Vcp}{Vj}\right)^m - \left(1+\frac{5}{2}\frac{Vcp}{Vj}\right)^m\left(1+\frac{Vcp}{Vj}\right)^m} \quad \text{EQ. 12}$$

using EQ. 10, EQ. 11 and EQ. 12
$$\frac{i}{l} = \frac{a(1+c)}{(1+a)}, \quad \frac{j}{l} = \frac{(b-a)(1+c)}{(1+a)(1+b)}, \quad \frac{k}{l} = \frac{(c-b)}{(1+b)}$$
EQ. 13, EQ. 14, EQ. 15

Numerical Evaluation:

The previously developed expressions can be numerically evaluated and values for i, j, k and l can be calculated. In the following example reasonable values for the variables are assumed.

Let
m=0.5, Vj=0.5 V, Vcp=3 V, $V_1$=2 Vcp=6 V, $V_2$=0 V and number of steps=5

Then
i/l=2.999218, j/l=1.888708, k/l=1.328689

In the expressions presented above, in the varactor characteristic $Cn = Cj0/(1-Vn/Vj)^m$:

Cn is the capacitance of the $n^{th}$ varactor

Vn is the DC voltage potential applied from the first electrode to the second electrode of the $n^{th}$ varactor Cj0 is the zero-bias junction capacitance Vj is the junction potential (built-in voltage)

m is the grading coefficient.

Figure 6:
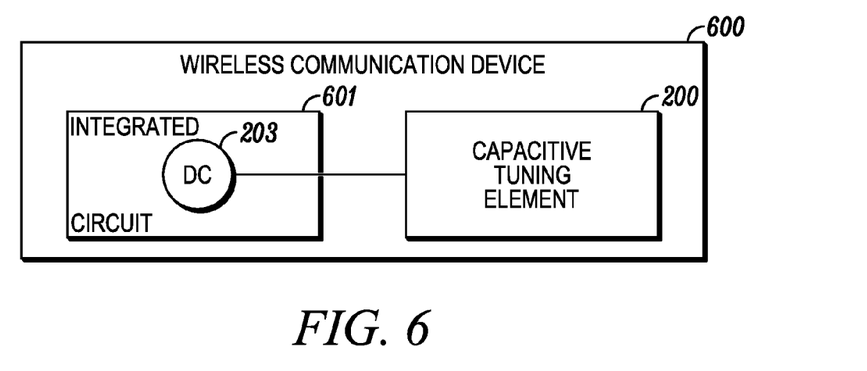
FIG. 6 comprises a block diagram as configured in accordance with various embodiments of the invention.
Figure 7:
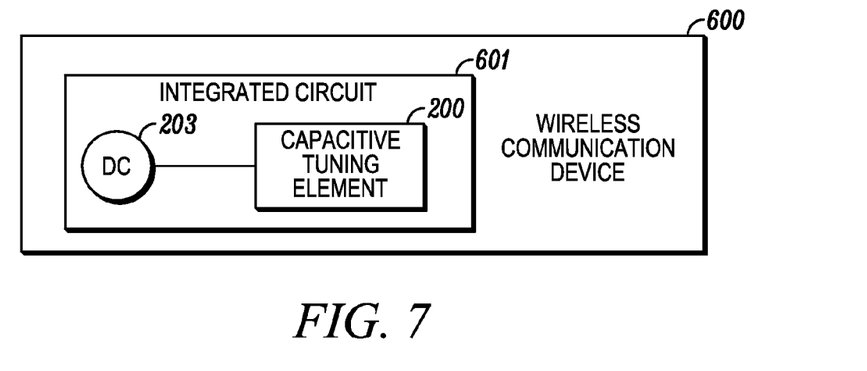
FIG. 7 comprises a block diagram as configured in accordance with various embodiments of the invention.

Such a capacitive tuning element 200 can be employed using low voltage processes and architectures. This offers great benefits, for example, when employed in conjunction with wireless communication devices (such as, but not limited to, cellular telephones and the like). As one illustrative embodiment in this regard, and referring now to FIG. 6, a wireless communication device 600 can have an integrated circuit 601 that uses low voltage architecture. This integrated circuit 601 may contain, for example, at least a substantial portion of the wireless communication device's 600 functionality (e.g., at least 40%, 60%, or even effectively 100% of the device's operational capability and wherewithal). In addition, this integrated circuit 601 can also comprise the direct current source 203 described above that provides a substantially continuously variable relatively low voltage signal to an off-board capacitive tuning element 200 as has been described herein. With reference to FIG. 7, it would also be possible for this integrated circuit 601 to partially or fully integrally comprise the capacitive tuning element 200 itself.

So configured, a low voltage process/architecture as is otherwise highly desirable can be used to realize the integrated circuit(s) of the wireless communication device and this can expressly include the control voltage source that is used to tune a corresponding capacitive tuning element. As these teachings permit a fully usable range of capacitive values to be available notwithstanding only a relatively low upper voltage value, these teachings are therefore seen to permit a highly (or fully) leveraged application of such low voltage processes and architecture in such an application setting. This, in turn, can lead to considerably improved design flexibility, power consumption control, and cost control capability.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

We claim:

1. A method comprising:
  providing a plurality of reverse-biased varactors wherein each of the varactors has a first electrode and a second electrode;
  coupling the first electrode for each of the plurality of varactors at a shared terminal;
  providing the shared terminal with a source of control voltage;
  providing a plurality of switches;
  coupling the second electrode for each of the plurality of varactors to a corresponding one of the plurality of switches, such that all of the plurality of varactors have a parallel coupling, such that each varactor of the plurality of varactors contributes to an overall aggregate capacitance and such that the second electrode for each of at least two of the plurality of varactors is separately switchable between at least two different voltage levels; and
  selecting a setting for each of the plurality of switches to select one particular aggregate-capacitive reactance range from multiple aggregate-capacitive reactance ranges provided by the plurality of varactors.

2. The method of claim 1 wherein providing a plurality of varactors comprises providing a plurality of varactors wherein at least some of the varactors have differing corresponding capacitances.

3. The method of claim 2 further comprising:
  selecting values for the differing corresponding convention capacitances in order to facilitate relatively equal spacing between aggregate-capacitive reactance ranges and to facilitate a rate of change of reactance versus control voltage that is substantially maintained for each of the aggregate-capacitive reactance ranges.

4. The method of claim 1 wherein the source of control voltage provides a substantially continuously variable direct current voltage.

5. The method of claim 1 further comprising:
  coupling one pole of each of the plurality of switches to a first one of the at least two different voltage levels; and
  coupling another pole of each of the plurality of switches to a second one of the at least two different voltage levels.

6. The method of claim 1 further comprising:
  coupling the second electrode for each of the plurality of varactors to a radio frequency bypass capacitor.

7. The method of claim 1 further comprising:
  providing a particular voltage value from the source of control voltage to select a particular aggregate capacitive reactance value within the selected one particular aggregate-capacitive reactance range.

8. An apparatus comprising:
  a plurality of reversed-biased varactors wherein each of the varactors has a first electrode and a second electrode, wherein all of the plurality of varactors are coupled in parallel, and wherein each varactor of the plurality of varactors contributes to an overall aggregate capacitance;
  a control voltage interface that provides a control voltage to each of the first electrodes; and
  a plurality of switches, wherein the second electrode for at least two of the plurality of varactors each couple to separate ones of the plurality of switches, wherein each of the plurality of switches couples to a first voltage level source and a second voltage level source, wherein the second voltage level is different than the first voltage level, and wherein the parallel coupling of the plurality of varactors provides multiple ranges of aggregate-capacitive reactances.

9. The apparatus of claim 8 wherein the second electrode for each of the plurality of varactors each couples to separate ones of the plurality of switches, such that each of the second electrodes can be individually switched to either one of the first voltage level source and the second voltage level source.

10. The apparatus of claim 8 further comprising a plurality of radio frequency bypass capacitors, wherein the second electrode of each of the plurality of varactors couples to a corresponding separate one of the plurality of radio frequency bypass capacitors.

11. The apparatus of claim 10 wherein each of the plurality of radio frequency bypass capacitors couples to a common radio frequency node.

12. The apparatus of claim 8 wherein the plurality of varactors comprise at least two varactors that have different capacitive values as compared to one another.

13. The apparatus of claim 8 wherein the control voltage interface is operably coupled to a source of direct current substantially continuously variable relatively low voltage signal.

14. The apparatus of claim 8 wherein the apparatus comprises a capacitive tuning element.

15. A wireless communication device comprising:
an integrated circuit formed using low voltage architecture, wherein the integrated circuit sources a direct current substantially continuously variable relatively low voltage signal;
a plurality of reverse-biased varactors wherein each of the varactors has a first electrode and a second electrode, wherein each of the first electrodes couples to receive the direct current substantially continuously variable relatively low voltage signal, wherein all of the plurality of varactors are coupled in parallel, and wherein each varactor of the plurality of varactors contributes to an overall aggregate-capacitance; and
a plurality of switches, wherein the second electrode for at least two of the plurality of varactors each couple to separate ones of the plurality of switches, wherein each of the plurality of switches couples to a first voltage level source and a second voltage level source, wherein the second voltage level is different than the first voltage level, and wherein the parallel coupling of the plurality of varactors provides multiple ranges of aggregate-capacitive reactances.

16. The wireless communication device of claim 15 wherein the plurality of varactors and the plurality of switches comprise an integral part of the integrated circuit.

17. The wireless communication device of claim 15 wherein the plurality of varactors and the plurality of switches are non-integral with respect to the integrated circuit.

18. The wireless communication device of claim 15 wherein at least a substantial portion of the wireless communication device's functionality resides within the integrated circuit.

* * * * *

UNITED STATES PATENT AND TRADEMARK OFFICE
CERTIFICATE OF CORRECTION

| | | |
|---|---|---|
| PATENT NO. | : 7,646,257 B2 | |
| APPLICATION NO. | : 11/621769 | |
| DATED | : January 12, 2010 | |
| INVENTOR(S) | : Gailus et al. | |

It is certified that error appears in the above-identified patent and that said Letters Patent is hereby corrected as shown below:

1. In Column 6, Line 47, delete "V1=2" and insert -- V1=2 V, --, therefor.

2. In Column 8, Line 32, in Claim 3, delete "corresponding convention" and insert -- corresponding --, therefor.

3. In Column 10, Line 8, in Claim 14, delete "aggregate-capacitance;" and insert -- aggregate capacitance; --, therefor.

Signed and Sealed this
Twenty-first Day of February, 2012

David J. Kappos
*Director of the United States Patent and Trademark Office*